Figure 1:
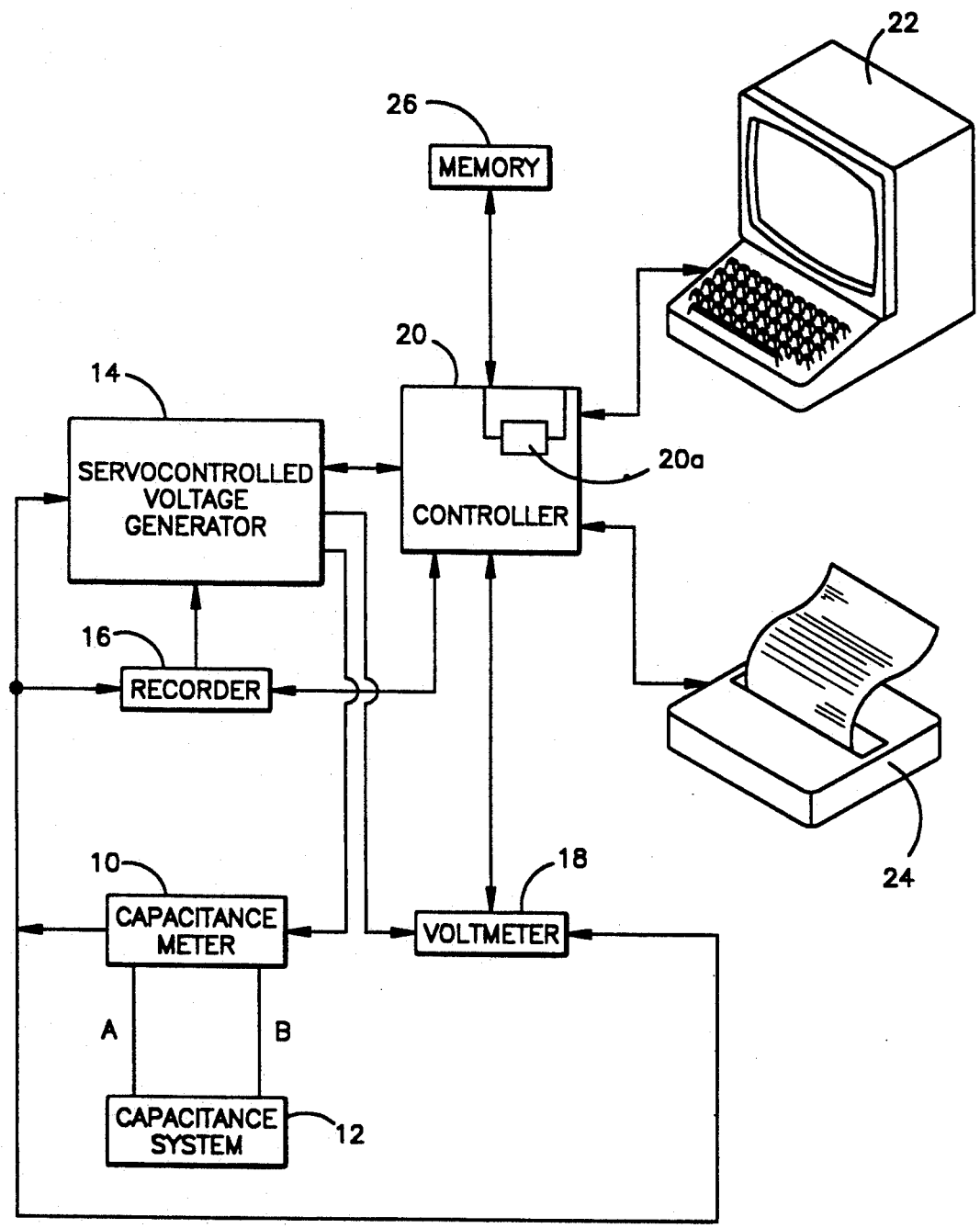

United States Patent [19]
Toffoli et al.

[11] Patent Number: 5,233,307
[45] Date of Patent: Aug. 3, 1993

[54] PROCESS AND APPARATUS FOR THE QUALIFICATION OF A CAPACITIVE SYSTEM

[75] Inventors: Alain Toffoli, Vif; Jean-Luc Pelloie, Moirans, both of France

[73] Assignee: Commissariat a l'Energie Atomique, Paris, France

[21] Appl. No.: 852,812

[22] Filed: Mar. 17, 1992

[30] Foreign Application Priority Data

Mar. 29, 1991 [FR] France .................. 91 03872

[51] Int. Cl.$^5$ .......................................... G01R 27/26
[52] U.S. Cl. ................................ 324/678; 324/158 R
[58] Field of Search ............... 324/678, 158 R, 158 D, 324/676, 677

[56] References Cited

U.S. PATENT DOCUMENTS

| | | | |
|---|---|---|---|
| 3,824,459 | 7/1974 | Uchida | 324/678 |
| 3,882,391 | 5/1975 | Liles et al. | 324/158 D |
| 4,323,842 | 4/1982 | McGarrity et al. | 324/158 D |
| 4,509,012 | 4/1985 | Lin | 324/158 D |
| 5,027,064 | 6/1991 | Cripps | 324/158 D |

FOREIGN PATENT DOCUMENTS

2514903 10/1981 France .

OTHER PUBLICATIONS

"A Modified Linear Sweep Tachnique for MOS-C Generation Rate Measurements", Pierret and Small, IEEE Transactions on Electron Devices vol. ED-22 No. 11, Nov. 1975 (New York, N.Y.).

"A Computer Controlled System for Transient Capacitance Measurements of Deep Levels in Semiconductors", Woon et al., IEEE Transactions on Instrumentation & Measurement, vol. 37, No. 1, Mar. 1988, New York, N.Y.

*Primary Examiner*—Gerard R. Strecker
*Assistant Examiner*—Maura K. Regan
*Attorney, Agent, or Firm*—Pearne, Gordon, McCoy & Granger

[57] ABSTRACT

During a first period, the capacitive system to be qualified is polarized so as to be in the initial state (which can be accumulation or inversion in the case of a capacitive MIS semiconductor system). During a second period, the system is polarized so as to be in the depletion state with constant capacitance. As from a determined instant during the second period, the capacitive value of the system is recorded. This value serves as a reference for the servocontrol of the variation of the polarization voltage maintaining the capacitive system in the depletion state. The measurement of the servocontrol voltage makes it possible to obtain the desired qualification.

6 Claims, 3 Drawing Sheets

PROCESS AND APPARATUS FOR THE QUALIFICATION OF A CAPACITIVE SYSTEM

DESCRIPTION

The present invention relates to a process and an apparatus for the qualification of a capacitive system with a single component, an electrical circuit and a semiconductor or non-semiconductor electronic circuit. It more particularly applies to the measurements of the "life" or spectroscopic qualification measurements within the framework of a capacitive semiconductor system.

A process and an apparatus for the qualification of a capacitive system are described in an article by R. F. Pierret and W. Small, published in IEEE Transactions on Electron Devices, November, 1975, vol. 3, pp. 1051/2. To the system to be tested is applied a first polarization voltage V1, so as to bring the said capacitive system into the accumulation state. This is followed by the application of a second polarization voltage V2, so as to bring the capacitive system into the depletion state. The change of polarization voltage causes a variation in the capacitive value of the tested system, which passes from C1 to C2. If, after its passage from V1 to V2 the polarization voltage is kept constant, the capacitance evolves progressively towards an equilibrium value C3.

According to the process described in this article, the polarization voltage is servocontrolled in such a way as to keep the value of the capacitance constant at C2. The measurement of the variation of the polarization voltage makes it possible to characterize the capacitive system by e.g. deducing the "life".

A capacitance meter makes the measurement of the capacitance of the capacitive system. Prior to the qualification test, an operator measures the capacitance value C2 in the depletion state, which will then serve as a reference for the servocontrol.

In order to carry out the test, the reference value is manually regulated. The measurement performed by the capacitance meter during time is compared with the reference value for regulating the servocontrol of the polarization voltage.

This process is not very accurate at the start of the measuring cycle. It does not permit the performance of tests in the case where the servocontrol voltage variation as a function of time is fast (equal to or exceeding 5 V/s).

Thus, in this case, the capacitive system is only in the depletion state for a period well below 1 second. The value of the capacitance used as the reference is visually established following a first passage of the capacitance into the depletion state, which leads to the imprecision.

The invention obviates this disadvantage. The measurement of the capacitance value in the depletion state, which serves as a reference value, is carried out automatically during the test cycle. The faster it is the more accurate the measurement of the value C2, which permits the performance of qualification tests, even with rapid variations.

Therefore the invention relates to a process for the qualification of a capacitive system comprising:

a) during a first period, applying a first polarization voltage V1 to the capacitive system to be qualified, said voltage V1 placing the capacitive system in an initial state with a given capacitive value C1, b) during a second period, applying a second polarization voltage V2 to the capacitive system to be qualified, said voltage V2 placing the capacitive system in the depletion state with a given capacitive value C2 and measuring the voltage corresponding to the capacitive value C2 of the system to be qualified, c) during a third period, applying to the capacitive system a servocontrol voltage added to the voltage V2 so as to maintain the capacitive system in the depletion state with the capacitive value C2.

d) measuring the servocontrol voltage, whose time variation permits the desired qualification of the capacitive system, characterized in that:

e) as from a predetermined instant during the second period, recording takes place of the voltage corresponding to the capacitive value C2, said voltage serving as the reference voltage, the servocontrol voltage being proportional to a difference between the reference voltage and the voltage corresponding to the capacitive value measured during the third period.

Stage e) can also start during the first period in order to obtain the value of C1.

The proportionality factor of the servocontrol voltage is linked with the electronic means used for performing the process. The initial state can be an accumulation state or an inversion state, e.g. in a MIS semiconductor device.

According to a variant of the process, the recording of the reference voltage takes place after the detection of a sudden variation in the capacitive value from C1 to C2.

According to another variant of the process, the recording of the reference voltage takes place as from a predetermined instant starting from the beginning of the second period.

No matter which of the above variants is used, the time lag introduced makes it possible to record a voltage corresponding to a stabilized value of the capacitance in the depletion mode and consequently no account need be taken of intermediate states.

Advantageously, the recording of the reference voltage consists of a sampling for a given period of the voltage corresponding to the capacitive value and in a digital storage of the sampled value.

The digital recording of the reference voltage makes it possible to minimize the fluctuations which may appear with respect to the value of said voltage and maintain a low value throughout the test.

The present invention also relates to an automatic apparatus for the qualification of a capacitive system comprising:

a capacitance meter able to supply a polarization voltage between terminals connected to the capacitive system and to an output a continuous signal proportional to a capacitive value measured between its terminals, a servocontrolled, controllable voltage generator connected by an input to the output of the capacitance meter, said generator being able to supply:

on a first output connected to an input of the capacitance meter:

during a first period, a voltage V1 having a predetermined value, during a second period, a voltage V2 having a predetermined value, during a third period, a servocontrol voltage added to the voltage V2, said servocontrol voltage being proportional to a difference between a reference voltage and a voltage corresponding to a capacitive value measured by the capacitance meter during said third period, on a second output, the servocontrol voltage only, controllable recording means connected to the output of the capacitance meter and able to record and supply to an output connected to an input of the voltage generator, the reference voltage corresponding to a capacitive value measured during the second period, controllable voltage measuring means connected at the input to the output of the capacitance meter on the one hand and to the second output of the voltage generator on the other and able to supply, as required, a voltage corresponding to a measured capacitive value at least as from the second period and the servocontrol voltage, control means incorporating a clock and connected at the voltage generator to the recording means and to the voltage measuring means.

The expression measuring the voltage corresponding to a capacitive value does not mean a reading of said value, but the delivery of said voltage to the voltage measuring means, to the recording means and to the voltage generator.

According to a variant of the process and apparatus according to the invention, in order to ensure that the capacitance of the system to be qualified remains in the depletion state during the third period, the voltage corresponding to said capacitive value is acquired by control means via the voltage measuring means and the capacitance meter.

Advantageously, the recording means comprise:

controllable sampling means connected at the output of the capacitance meter and able to carry out a sampling of the voltage corresponding to a capacitive value supplied at the output of the capacitance meter, a controllable analog - digital converter connected at the input to an output of the sampling means, controllable storage means connected at the input to an output of the analog - digital converter, a digital - analog converter connected by an input to an output of the storage means.

The digital - analog converter may or may not be controllable, as a function of the means used for forming it. The term controllable means is understood to mean means controlled by the control means and therefore connected to the latter.

According to a constructional variant, the recording means comprise triggering means connected at the output of the capacitance meter and able to detect a sudden variation in the capacitive value measured by the capacitance meter and supply following said detection a triggering or release signal to an output connected to an input of the control means.

According to a variant, the triggering means comprise a differentiator.

Advantageously, the voltage generator comprises:

a controllable voltage source bale to successively supply the voltages V1 and V2 on an output, a differential amplifier connected by a first input to the output of the capacitance meter and by a second input to the output of the recording means, a controllable switch connected to one output of the differential amplifier, an adder connected by a first input to the switch and by a second input to the voltage source.

The control means can either be integrated with the other elements of the apparatus in an assembly, or can form part of a supplementary assembly.

The invention is described in greater detail hereinafter relative to non-limitative embodiments and the attached drawings, wherein show:

FIG. 1—Diagrammatically an apparatus according to the invention.

Figure 2:
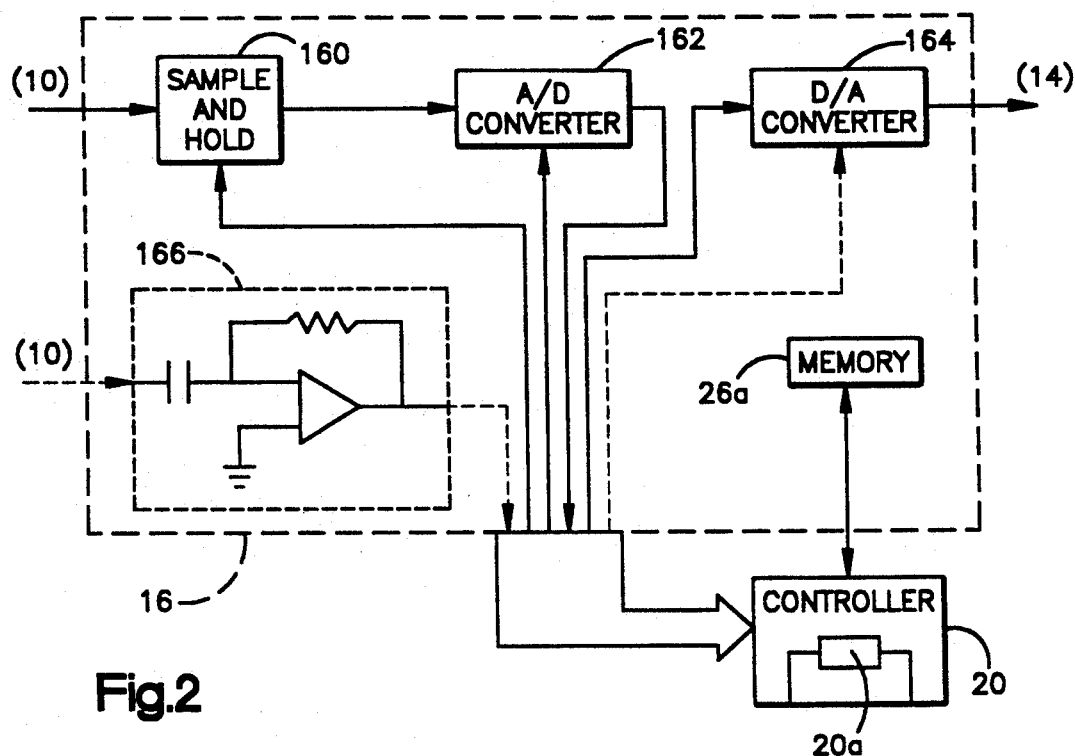

FIG. 2—Diagrammatically the recording means according to the invention.

Figure 3:
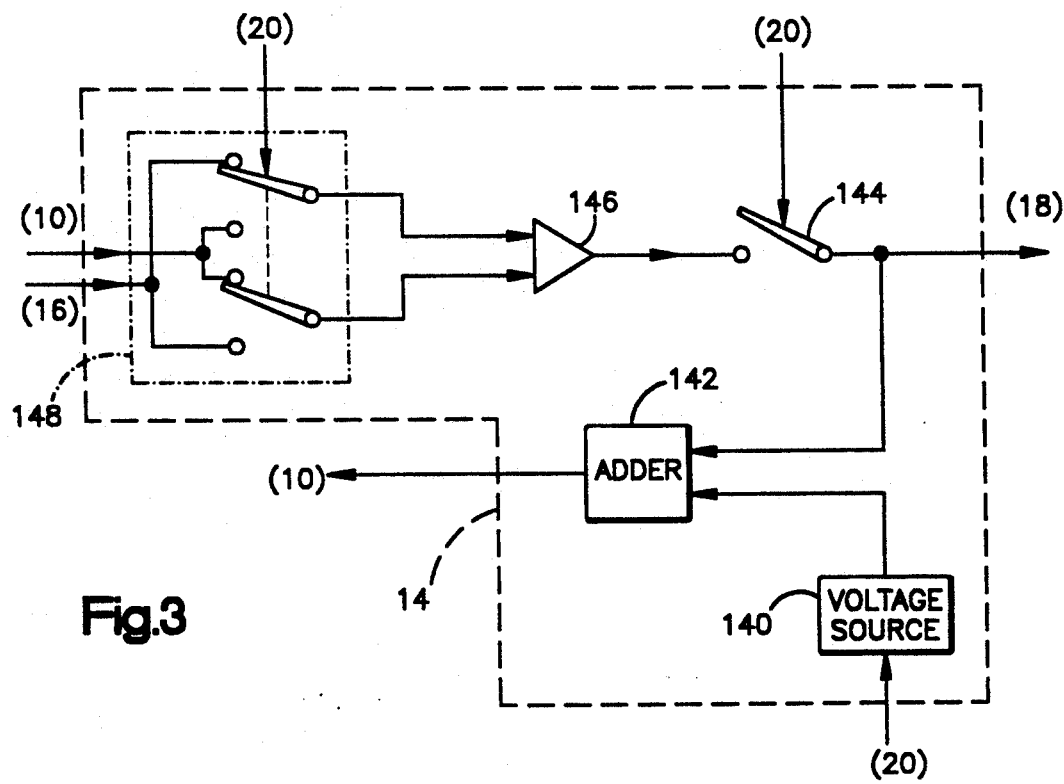

FIG. 3—Diagrammatically a voltage generator according to the invention.

Figure 4:
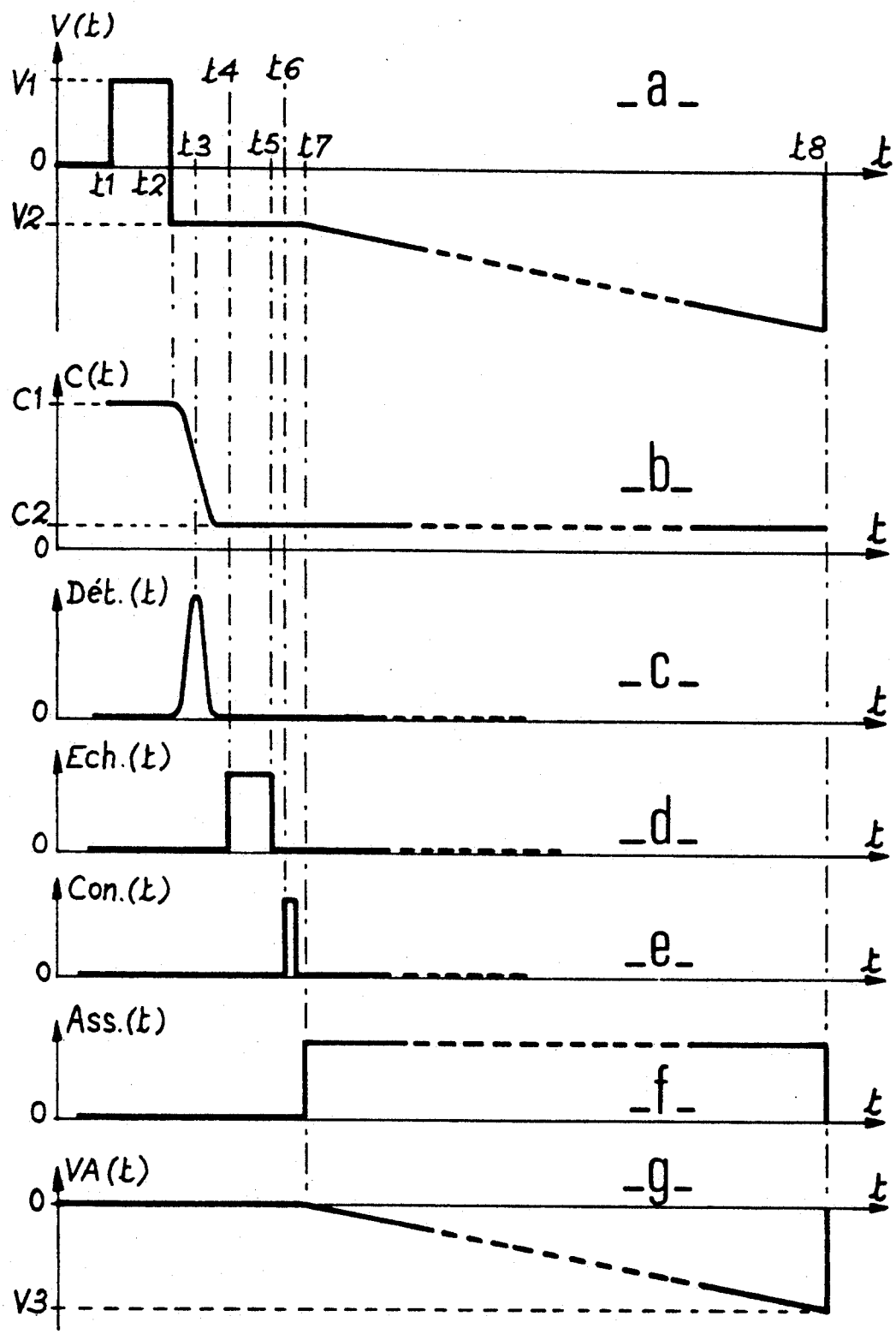

FIG. 4—Diagrammatically the timing chart of the different voltages used in performing a process according to the invention.

With reference to FIG. 1, a description will now be given of an apparatus according to the invention. A capacitance meter 10, e.g. of the type marketed by BOONTON under reference 72B, is connected by terminals A and B to the capacitive system 12 to be tested. The capacitance meter 10 applies a regulatable polarization voltage between its terminals. It supplies on an output a voltage corresponding to the measured capacitive value.

A controllable, servocontrolled voltage generator 14 connected by an input to the output of the capacitance meter 10 supplies on a first output connected to an input of the capacitance meter 10 the polarization voltage, which is recorded between the terminals of the capacitance meter 10.

As can be sen n FIG. 4, part a, the polarization voltage $V(t)$ varies in time.

During a first period from t1 to t2, the polarization voltage assumes a value V1 able to bring the capacitive system 12 into the initial state, which can e.g. be an accumulation state shown in FIG. 4 or an inversion state.

During a second period from t2 to t7, the polarization voltage assumes a value V2 able to place the capacitive system 12 in the depletion state.

During a third period from t7 to t8, the polarization voltage assumes a value which varies in time, so as to keep the capacitive system 12 in the depletion state. The latter polarization voltage is constituted by a servocontrol voltage $VA(t)$ added to V2.

The voltage generator 14 delivers to a second output the servocontrol voltage only. The variations of the latter are shown in FIG. 4, part g.

FIG. 4, part b, diagrammatically shows the variations of the capacitance of the capacitive system 12 during the three preceding periods. Between t1 and t2, the capacitance assumes the value C1 representative of the initial state, which can e.g. be accumulation or inversion in the case of a MIS semiconductor capacitive system.

As from t2, which is the instant representing the passage of the polarization voltage from V1 to V2, and up to the time t4, the capacitance is in the transient state. From t4 to t7, it assumes the value C2 representative of the depletion state. After t7, as a result of the servocontrol of the polarization voltage, the capacitance is kept constant at the value C2 with an accuracy equal to or below 0.1%.

Controllable recording means 16 are connected on the one hand by an input to the output of the capacitance meter 10 and on the other by an output to an input of the voltage generator 14. As from a predetermined instant of the second period, they record the voltage corresponding to the capacitive value during the depletion state and supply said value, as required, to the output (said voltage serving as the reference voltage, as will be shown hereinafter).

Voltage measuring means such as the voltmeter 18 are connected by a first input to the output of the capacitance meter 10 and by a second input to the second output of the voltage generator 14. It supplies, as required, to an output the value of the recording voltage and that supplied by the capacitance meter 10. These values make it possible to qualify the capacitive system 12, e.g. by deducing the life or any other characteristic. Control means 20 incorporating a clock 20a control and manage the operation of the voltage generator 14, the servocontrol means 16 and the voltmeter 18. They can be constituted by a processor. The latter can be connected to a terminal 22 permitting an external check, as well as to a printer 24.

The control means 20 can also be connected to a memory 26, where the result of the different measurements are recorded.

FIG. 2 diagrammatically shows exemplified recording means 16 according to the invention. The latter comprise a sample and hold circuit 160 sampling, under the control of the processor 20 and for a given time, of e.g. a few ms, the voltage corresponding to the capacitive value measured by the capacitance meter 10.

The analog sampled value is converted into a digital value by an analog - digital converter 162 controlled by the processor 20. The digital value is recorded, under the control of the processor 20, in a memory 26a, which can be a plane memory of the memory 26 or a supplementary memory. The storage of the digital value corresponding to the sample voltage guarantees the reliability of said value and makes it possible to avoid variations during an analog recording.

The recorded voltage serves as a reference voltage for the servocontrol. It is delivered via the processor 20 to the input of a digital - analog converter 164. The analog value is delivered at the output of the recording means to an input of the servocontrolled voltage generator 14.

According to a first variant, the control of the sampling is triggered by a release or triggering signal supplied by triggering means. The latter are constituted by a differentiator 166 connected at the input to the output of the capacitance meter 10 and at the output to the processor 20. The differentiator detects a sudden variation in the voltage corresponding to the capacitive value and delivers a voltage pulse serving as the release signal.

FIG. 4, part c, shows in diagrammatic manner the voltage pulse Det(t), which appears at instant t3 during the transient state (between instants t2 and t4) of the capacitive system.

As can be sen in FIG. 4, part d showing the sampling control Ech(t) delivered by the processor 20, sampling starts at instant t4 after a predetermined time (taking into account the response time of the capacitance meter) following the instant t3 of the appearance of the release signal. This time lag is such that sampling takes place between instants t4 and t5 during the period where the capacitive system is in the depletion state and outside the transient state, which ensures the value of the voltage serving as a reference for the servocontrol.

According to a variant of the recording means, the processor 20 controls the sampling at a given instant following the control of the polarization voltage change passing the capacitive system from the initial accumulation state to the depletion state. As previously, the time lag makes it possible to trigger sampling when the depletion state is stabilized. When sampling is ended, the processor 20 controls (signal Con(t), FIG. 4, part e) the analog - digital and digital - analog conversions.

FIG. 3 diagrammatically shows a voltage generator 14, which has a controllable voltage sourge 140 connected to the processor 20. This voltage source 140 is able to successively supply (under the control of the processor 20) the voltage V1 making it possible to bring the capacitive system 12 into the initial accumulation state and the voltage V2 making it possible to place the capacitive system 12 in the depletion state. The nature of the capacitive system determines the value and the sign of the voltages V1 and V2.

the Expert knows or knows how to determine the value and sign of the voltages V1 and V2. They are e.g. determined for a capacitive MIS semiconductor system from another characterization called C(V) (variation of the capacitance as a function of the polarization voltage applied to its terminals). This characterization makes it possible to determine a voltage V1, which places the capacitance in the initial state and which can e.g. be accumulation or inversion, and a voltage V2 placing the capacitance in the depletion state. For example, for a N-type semiconductor device, the voltage V1 corresponding to the initial state is positive if the state is accumulation and negative, but exceeding V2, if the state is inversion, the voltage V2 being negative. The situation is reversed for a P-type device.

The voltage generator 14 also produces the servocontrol voltage VA(t) (FIG. 4, part g). The latter is proportional to the difference, carried out by the differential amplifier 146, between the voltage supplied by the capacitance meter 10 and the reference voltage supplied by the recording means 16. Switching means 148, under the control of the processor 20 make it possible to connect the outputs of the capacitance meter 10 and the recording means 16 to the positive and negative inputs of the differential amplifier, as a function of the sign of the polarization V2 of the capacitive system 12.

A switch 144, controlled by the processor 20, is the output of the differential amplifier 146. The switch 144 is also connected to a first input of an adder 142. A second input of the adder 142 is connected to the output of the voltage source 140.

FIG. 4, part f diagrammatically shows the signal Ass(t) for controlling the switch 144 supplied by the processor 20. Up to the instant t7, the switch 144 is open and the adder 142 supplies the successive voltages V1 and V2 to its output. The switch 144 is closed as from t7 and the adder 142 supplies on its output the voltage 142 from 140 added to the servocontrol voltage VA from 146. The output of the adder 142 is connected to the input of the capacitance meter 10 and supplies it with the different polarization voltages. The servocontrol voltage is also supplied to an output of the voltage generator 14 connected to the voltmeter 18. The voltmeter supplies the results of its measurements to the processor 20 for processing. For example, the "life" of a semiconductor device can be determined on the basis of the gradient of VA(t).

The measurement is stopped by the processor 20 when the servocontrol voltage VA(t) assumes a given value V3 or at a given instant t8. The third period from t7 to t8 during which the measurement is performed can last from a few seconds to a few hours, whereas the second period from t2 to t7 lasts a few milliseconds.

We claim:

1. An automatic apparatus for the qualification of a capacitive system comprising:

a capacitance meter (10) supplying a polarization voltage between terminals (A, B) connected to the capacitive system and supplying a continuous voltage proportional to a capacitive value measured between the terminals, a servocontrolled voltage generator (14) connected to the capacitance meter (10) and supplying to the capacitance meter (10):

during a first period, a first voltage V1 having a predetermined value which places the capacitive system (12) in an initial state with a first capacitive value C1, during a second period, a second voltage V2 having a predetermined value which places the capacitive system (12) in a depletion state with a second capacitive value C2, during a third period, a servocontrol voltage VA added to the second voltage V2, said servocontrol voltage being proportional to a difference between a reference voltage corresponding to a capacitive value measured by the capacitance meter at a predetermined instant of the second period and a voltage corresponding to a capacitive value measured by the capacitance meter during said third period, the servocontrol voltage varying to maintain the capacitive system at the second capacitive value, controllable voltage measuring means (18) connected to the voltage generator (14) to measure at least the servocontrol voltage which permits the qualification of the capacitive system, controllable recording means (16) connected to the capacitance meter (10) and to the voltage generator to record and supply to the voltage generator (14) the reference voltage, the recording means comprising:

controllable sampling means (160) connected to the capacitance meter (10) to carry out a sampling of the reference voltage supplied by the capacitance meter, triggering means (166) for initiating the sampling at the predetermined instant of the second period, a controllable analog-to-digital converter (162) connected at an input to the sampling means, a digital-to-analog converter (164) having an output connected to an input of the voltage generator, storage means (26a) connected to an output of the analog-to-digital converter and to an input of the digital-to-analog converter, and control means (20) incorporating a clock and connected to the voltage generator, to the voltage measuring means, to the controllable sampling means, to the storage means, to the triggering means, and to the analog-to-digital and digital-to-analog converters.

2. An apparatus according to claim 1, wherein the triggering means (166) is connected to the capacitance meter (10) and detects a sudden variation in the voltage corresponding to the capacitive value measured by the capacitance meter, the instant of the detection corresponding to the predetermined instant to supply as a result of said detection a release signal to the control means (20).

3. An apparatus according to claim 2, wherein the triggering means (166) incorporates a differentiator.

4. An apparatus according to claim 1, wherein the voltage generator (14) comprises:

a controllable voltage source (140) connected to the control means (20) and successively supplying the first and second voltages V1 and V2, a differential amplifier (146) connected to the capacitance meter (10) and to the recording means (16), a controllable switch (144) connected to the differential amplifier (146), to the control means and to the controllable voltage measuring means, and an adder (142) connected to the switch (144), to the voltage source (140) and to the capacitance meter.

5. An apparatus according to claim 1 wherein the controllable voltage measuring means is connected to the capacitance meter.

6. An apparatus according to claim 1 wherein the predetermined instant is determined from the start of the second period.

* * * * *

UNITED STATES PATENT AND TRADEMARK OFFICE
CERTIFICATE OF CORRECTION

PATENT NO. : 5,233,307

DATED : August 3, 1993

INVENTOR(S) : Alain Toffoli et al.

It is certified that error appears in the above-identified patent and that said Letters Patent is hereby corrected as shown below:

Column 3, line 60, delete "bale" and insert --able--.

Column 4, line 31, delete "sen n" and insert --seen in--.

Column 6, line 16, delete "the" (first occurrence) and insert --The--.

Signed and Sealed this

Nineteenth Day of April, 1994

Attest:

BRUCE LEHMAN

*Attesting Officer*  *Commissioner of Patents and Trademarks*